United States Patent [19]

Turner

[11] 4,112,764

[45] Sep. 12, 1978

[54] AUTOMATIC ON/OFF DIGITALLY TIMED ELECTRONIC SWITCH

[75] Inventor: Robert B. Turner, Weymouth, Mass.

[73] Assignee: Johnson & Johnson, New Brunswick, N.J.

[21] Appl. No.: 758,618

[22] Filed: Jan. 12, 1977

[51] Int. Cl.² .................. G01K 7/16; H03K 17/26
[52] U.S. Cl. ..................... 73/362 AR; 307/293; 328/129
[58] Field of Search ............. 73/362 AR; 307/293; 328/129

[56] References Cited

U.S. PATENT DOCUMENTS

| | | | |
|---|---|---|---|
| 3,852,623 | 12/1974 | Nelson et al. | 307/293 |
| 3,875,503 | 4/1975 | Hayashi | 73/362 AR X |
| 3,909,620 | 9/1975 | Matsuda et al. | 307/293 |
| 3,965,743 | 6/1976 | Turner | 73/362 AR |
| 4,001,599 | 1/1977 | Karklys | 307/293 X |

Primary Examiner—James J. Gill

[57] ABSTRACT

An electronic thermometer system is disclosed including a circuit for measuring temperature variations, a time measuring circuit, a display for consecutive display of time and temperature, and an automatic digitally timed electronic switch.

The automatic on/off digitally timed electronic switch is responsive to momentary operation of an actuator to turn on and remain on through a predetermined interval including an electronic switch having a latching circuit adapted for connection to a power supply; a drive circuit is responsive to momentary supply of power by operation of the actuator to provisionally begin operating and provide a gating signal to operate the latching circuit; means is provided interconnecting the latching circuit and drive circuit for continuing operation of the drive circuit independent of the momentary supply of power; and a digital timer circuit including counting means is responsive to momentary operation of the actuator to begin counting and provide at a predetermined count an output to inhibit further operation of the drive circuit and deenergize the latching circuit.

5 Claims, 5 Drawing Figures

AUTOMATIC ON/OFF DIGITALLY TIMED ELECTRONIC SWITCH

FIELD OF INVENTION

This invention relates to an automatic on/off digitally timed electronic switch which remains on independent of and subsequent to momentary actuation and which is adapted for use in an electronic thermometer, and more particularly to such a switch which is precisely digitally controlled to turn off after a predetermined interval of time.

BACKGROUND OF INVENTION

Electronic thermometer systems are initially relatively expensive compared to mercury thermometers but over their useful life they cost considerably less to use and are less consuming of the time of scarce and expensive medical personnel. Since these thermometers are electronic they require electrical power for their operaton which is supplied in the form of batteries to promote the portability of the electronic thermometer systems. The system requires substantial electrical power to operate the sensing and measuring circuits and to operate the display. Periodically the batteries are removed and replaced with new ones at additional cost or the system is removed from service while the batteries are recharged. Poorer battery duty cycles result if the user habitually unnecessarily extends the measuring and display period or inadvertently fails to switch off the system at the end of its use.

Recently an automatic on/off electronic switch was developed, U.S. Pat. No. 3,965,743, which upon momentary operation of an actuator locked on and turned off automatically after a predetermined interval of time, and it has performed adequately to conserve battery power. However, this prior automatic on/off electronic switch had some shortcomings. There was no way to extend the temperature display period: subsequent operation of the actuator either during the display or after it ended simply restarted the entire thermometer cycle with a re-measurement and display of temperature. In addition the time interval for the temperature display was controlled by an RC network. Since the time interval was nominally 10 seconds the capacitor used was a large, usually tantalum capacitor whose value was less than precise and often resulted in the interval reaching 15 or even 20 seconds. This caused serious difficulty in estimating battery life and maintaining all thermometers operative by means of timely battery recharging or replacement.

SUMMARY OF INVENTION

It is therefore an object of this invention to provide an improved simple and inexpensive automatic on/off digitally timed electronic switch.

It is a further object of this invention to provide such a switch whose operating interval is precise, repeatable, and predictable.

It is a further object of this invention to provide such a switch which enables recycling of the operating interval.

It is a further object of this invention to provide such a switch usable in an electronic thermometer system to conserve power, maintain precise, repeatable, and predictable temperature display and permit recycling of the temperature display independent of restarting of the entire thermometer system measuring cycle.

The invention results from the realization that a simple, precise recycleable operation interval could be established using an automatic on/off digitally timed electronic switch which locks up on momentary actuation and turns off in response to a precise digital timing control.

The invention features an automatic on/off digitally timed electronic switch which is responsive to momentary operation of an actuator to turn on and remain on for a predetermined interval. It includes an electronic switch having a latching circuit adapted for connection to a power supply and a drive circuit responsive to momentary supply of power by operation of the actuator to provisionally begin operating and to provide a gating signal to operate the latching circuit. Means interconnect the latching circuit and drive circuit for subsequently continuing operation of the drive circuit independent of the momentary supply of power. A digital timer circuit includes counting means responsive to the momentary operation of the actuator to begin counting and provide at a predetermined count an output to inhibit further operation of the drive circuit and deenergize the latching circuit. In a preferred embodiment the drive circuit includes means for storing a voltage level produced by the momentary supply of power and the digital timer circuit includes a reset circuit responsive to each momentary application of power effected by operation of the actuator to recycle the counting means and reinitiate the predetermined interval.

The automatic on/off digitally timed electronic switch may be used in an electronic thermometer system which includes a temperature measuring circuit for measuring temperature variations and providing a signal representative thereof, a time measuring circuit and a display circuit responsive to the time measuring circuit and the temperature measuring circuit for indicating the measured temperature during one period and the measured time during another period. Typically the time is displayed during a first period and the temperature during the next period of the interval.

DISCLOSURE OF PREFERRED EMBODIMENT

Other objects, features and advantages will occur from the following description of a preferred embodiment and the accompanying drawings, in which.

Figure 1:
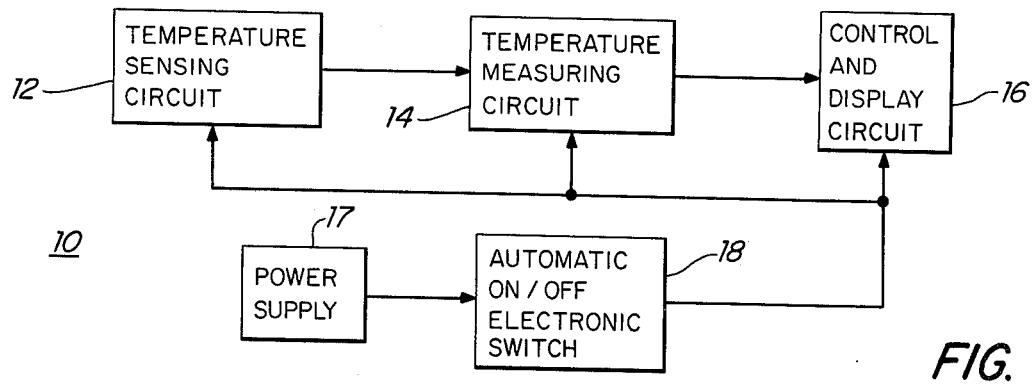
FIG. 1 is a block diagram of an electronic thermometer system using an automatic on/off digitally timed electronic switch according to this invention.
Figure 4:
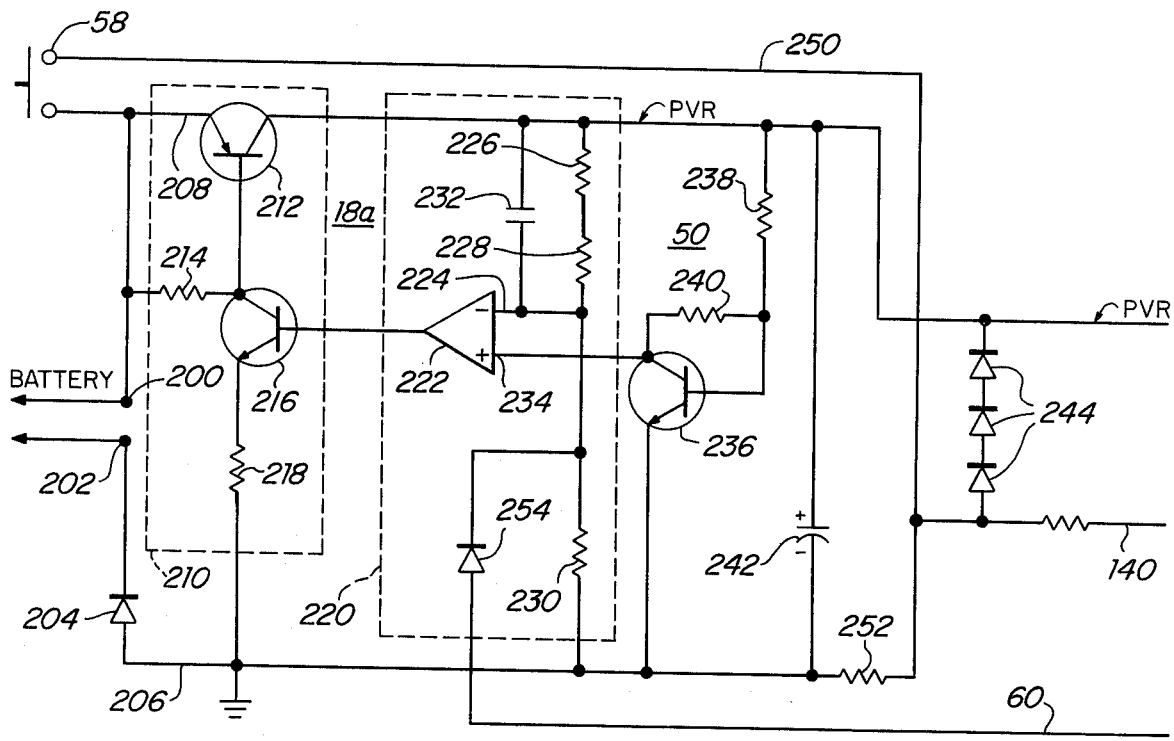
FIG. 4 is a detailed schematic diagram of one implementation of the electronic switch of FIG. 3; and, FIG. 5 is a detailed schematic of the gating circuit of FIG. 3.

There is shown in FIG. 1 an electronic thermometer system 10 according to this invention including a temperature sensing circuit 12 which senses variations in temperature and provides a signal representative thereof to measuring circuit 14 which responds by providing a signal representative of the measured temperature to control and display circuit 16. Power is supplied to circuits 12, 14 and 16 from power supply 17 under the control of automatic on/off digitally timed electronic switch 18.

In preferred embodiments measuring circuit 14 may include a voltage to rate converter or similar analog to digital converter which provides a series of pulses representing the measured temperature to control and display circuit 16. Control and display circuit 16 may include counting circuits for counting pulses from measuring circuit 14 and a digital display for displaying the measured temperature. Control and display circuit 16 may also include a time measuring circuit and control circuitry for displaying the time during one period and the temperature during another.

Figure 2:
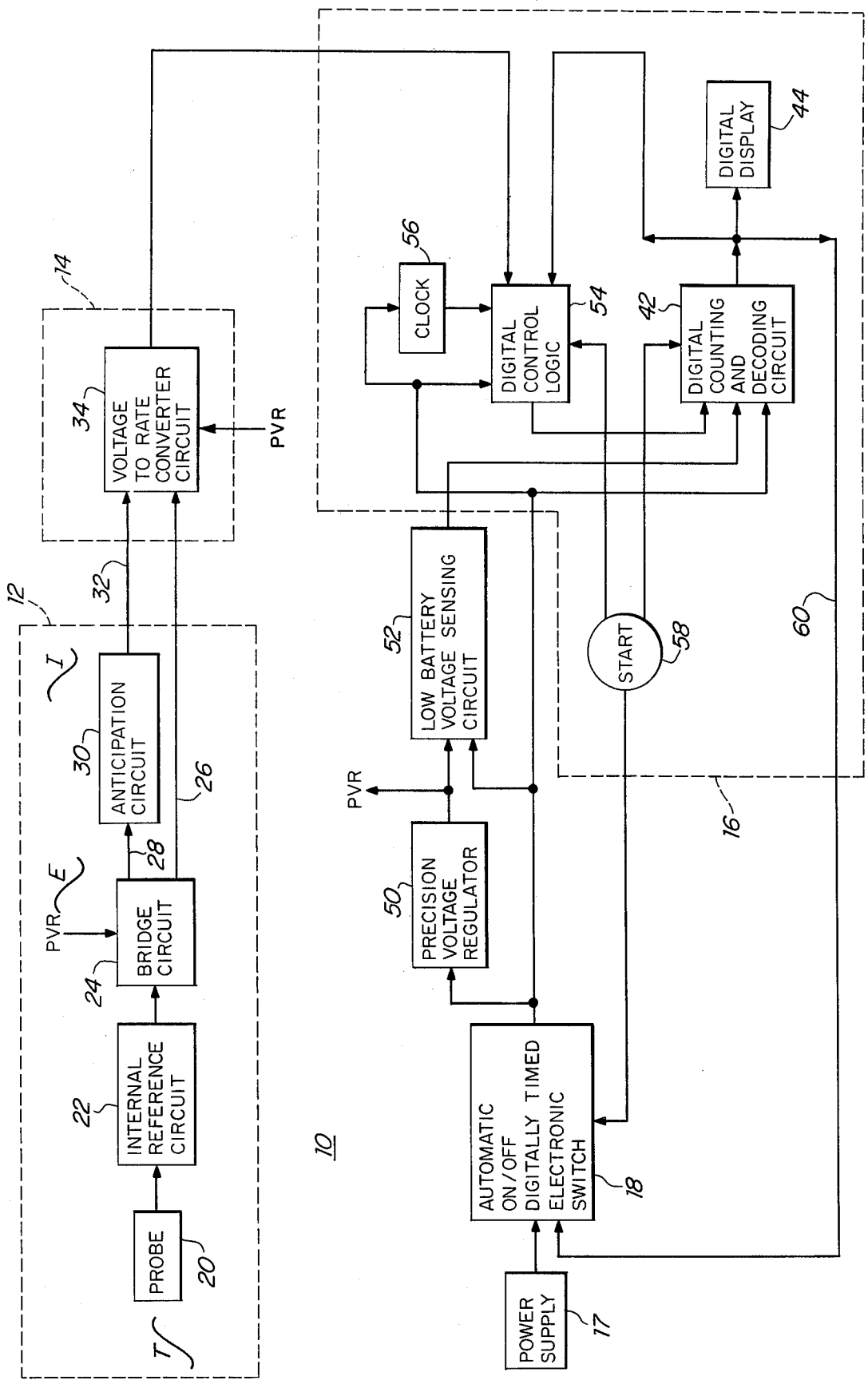
FIG. 2 is a more detailed block diagram illustrating one implementation of the system of FIG. 1.

In one specific embodiment temperature sensing circuit 12 may include a probe 20, FIG. 2, for sensing a temperature to be measured and producing a signal representative thereof which is submitted through internal reference circuit 22 to bridge circuit 24. Internal reference circuit 22 selectively connects a matching circuit to bridge circuit 24 in place of the input from probe 20 so that the accuracy and operation of the system can be verified. Bridge circuit 24 provides a reference output on line 26 and on line 28 provides a varying output as a function of the bridge imbalance: an analog signal which is a function of the temperature sensed by probe 20. In this system used primarily to take the temperatures of humans the measurement range is from 90° F to 110° F. Thus reference output 26 of bridge circuit 24 represents the level of 90° F; when output 28 of bridge circuit 24 is equal to reference output 26 thermometer probe 20 is measuring a temperature of 90° F. When output 28 is at a predetermined deviation from the level of output 26 probe 20 is measuring 110° F. Output 28 is fed to anticipation circuit 30 which senses the rate of change of the temperature being sensed by probe 20 and adds to the signal on output 28 from bridge circuit 24, thereby providing a signal on line 32 to voltage to rate converter 34 representative of the final value of the temperature being sensed in advance of the actual sensing of that final value.

In measuring circuit 14 which includes voltage to rate converter circuit 34, the greater the difference between lines 26 and 32 to voltage to rate converter circuit 34, the higher will be the repetition rate of the pulses provided at the output of circuit 34; this repetition rate is proportional to the temperature being sensed by probe 20.

Control and display circuit 16 includes digital counting and decoding circuit 42 which counts the digital pulses provided at the output of voltage to rate converter circuit 34 and decodes that count to display the measured temperature on digital display 44.

Precision voltage regulator 50 provides regulated voltage, PVR, to bridge circuit 24, voltage to rate converter circuit 34, and low battery voltage sensing circuit 52. The other input to low battery voltage sensing circuit 52 is the unregulated power supplied at the output of automatic on/off digitally timed electronic switch 18. When the unregulated power supply voltage decreases to a predetermined level relative to the regulated voltage output provided by precision voltage regulator 50, low battery voltage sensing circuit 52 provides a signal to digital counting and decoding circuit 42 causing it to extinguish the least significant digit of the temperature appearing in digital display 44.

The specific embodiment of electronic thermometer system 10 illustrated in FIG. 2 operates in two modes: a time display mode and a temperature display mode. Digital control logic 54 supervises system performance in each of these modes and controls the transition between them as a function of control and display circuit 16. In the time display mode digital control logic 54 passes pulses from clock 56 to digital counting and decoding circuit 42; while in the temperature display mode digital control logic 54 directs pulses from voltage to rate converter circuit 34 to digital counting and decoding circuit 42. The system is operated by actuation of start switch 58.

In operation when start switch 58 is actuated automatic on/off digitally timed electronic switch 18 is turned on to supply power from power supply 17 to the rest of the system and digital control logic 54 and digital counting and decoding circuits 42 are reset. Probe 20 in contact with the patient whose temperature is to be measured begins to sense the temperature. As the probe temperature T increases, the voltage E at output 28 of bridge circuit 24 decreases. The difference in levels of output 26 and output on line 32 causes pulses to be generated at the output of voltage to rate converter circuit 34. The repetition rate of the pulses stabilizes in a short period of time to represent the final value of the temperature being sensed. This time may be reduced still further by the use of anticipation circuit 30 as explained previously.

Simultaneously with this action, upon the actuation of start switch 58, automatic on/off digitally timed electronic switch 18 stays on for a predetermined period of time after the start switch 58 has been operated. In this particular embodiment, where there is both a time and a temperature measurement and display the interval of operation includes both the period of time display mode and the period of the temperature display mode, e.g. thirty seconds and ten seconds, respectively. A signal to automatic on/off digitally timed electronic switch 18 on line 60 signifies the end of the display.

Simultaneously with the actuation of start switch 58 digital control logic 54 passes clock pulses from clock 56 to digital counting and decoding circuit 42. These clock pulses may have a duration of one-hundred milliseconds so that a count of ten such clock pulses by digital counting and decoding circuit 42 indicates one second. At the end of each second so accumulated digital display 44 is enabled to display the numbers 1 through 29, representig the time. At the thirtieth second digital control logic 54 transfers the system into the temperature display mode by permitting passage, for the period of one clock pulse, of the pulses at the output of voltage to rate converter circuit 34 to digital counting and decoding circuit 42 which accumulates and decodes the count and causes the temperature to be displayed.

Automatic on/off digitally timed electronic switch 18 generally includes two parts (FIG. 3): electronic switch circuit 18a and digital timer circuit 18b. Display 44 includes four digit displays, 100, 102, 104, and 106 which are driven by four decoders 108, 110, 112, and 113 which form a portion of digital counting and decoding circuit 42. Also included in that circuit are counters 114, 116, and 118 and gate circuit 120.

Digital control logic 54 includes a gating circuit 122, time and temperature flip-flop 124, latch and gate flip-flop 126 and flip-flop reset 128. Digital timer circuit 18b includes a period counter 130 and gate circuit 132 and counter reset 134. Gating circuit 122 and its various inputs as well as counters 114, 116 and 118 function as a part of digital timer circuit 18b. The reset R input to flip-flops 124 and 126 resets them so that their $\overline{Q}$ outputs go high and their Q outputs go low. The signal on their D inputs enables them to switch to the set condition in which $\overline{Q}$ is low and Q is high upon the occurrence of the signal to the clock, CL, input.

In operation, operating actuator or start button 58 causes electronic switch 18a to provide a signal on line 140 to flip-flop reset 128 and on line 142 to counter reset 134. Flip-flop reset 128 receives its second necessary input on line 144 from the Q output of flip-flop 126 which is presently in the high state. This results in a signal at the output of flip-flop reset 128 on line 146 to the reset, R, input of flip-flops 124 and 126 which definitively resets each of them. Now with line 142 high and line 148 coming from the $\overline{Q}$ output of flip-flop 126 low, counter reset 134 is enabled to provide a signal on line 150 to reset counters 114, 116, and 118 and on line 152 to reset period counter 130 through gate circuit 132.

Gating circuit 122 receiving the high $\overline{Q}$ output of flip-flop 126 and the low Q output of flip-flop 124 along with the PVR input is enabled to pass clock pulses from clock 56 to counter 114. Counter 114 counts tenths of a second, counter 116 units, and counter 118 tens. Thus after counter 114 counts to .9 seconds it recycles and overflows into counter 116 setting it to a "1". After counter 116 reaches 9 seconds it recycles and overflows placing a "1" in counter 118 and on a subsequent cycle places a "2" in counter 118. Typically during this, the time mode of operation of electronic thermometer system 10, decoders 108 and 113 are blanked so that only the units and tens digits are displayed at positions 102 and 104 of display 44. After twenty-nine seconds have been reached, gate circuit 120 provides an output on line 166 to the clock, CL, input of flip-flop 124. Since the D input is continuously receiving a signal from PVR the occurrence of this signal at CL switches flip-flop 124 to the set position placing the Q output in the high state. With the Q output of 124 high the signal is provided on line 162 to the D input of flip-flop 126 and the signal goes high on line 164 to gating circuit 122. This enables gating circuit 122 to stop passing pulses from clock 56 and begin to pass pulses from voltage to rate converter circuit 34, for one clock period or one-hundred milliseconds, which represent the temperature being sensed. The pulses from voltage rate converter 34 are delivered to counter 114 which functions in the same way as previously as do counters 116 and 118. Upon the completion of the clock pulse during which the pulses from the voltage to rate converter circuit 34 are being counted a signal is applied on line 168 to the clock, CL, input of flip-flop 126 which is already enabled at its D input by the signal on line 162 and so it switches to the set input whereupon the Q output goes to the high state and $\overline{Q}$ to the low state. With $\overline{Q}$ in the low state a signal is delivered on line 170 to latch each of decoders 108, 110, 112 and 113, so that the count now accumulated representing the temperature is locked into the decoders for display in display 44 and the decoders will not respond to any further action by counters 114, 116 and 118. At this time typically all four display positions 100, 102, 104, 106 are used to display the temperature as necessary from 90.0° F to 110.0° F. Simultaneously, the $\overline{Q}$ output removes the inhibit signal on line 172 which has, through gate circuit 132, been preventing period counter 130 from accumulating the overflow from counter 116 presented on line 174. With the Q output high from flip-flop 126 the signal on line 148 and the absence of the signal on line 142 causes counter reset circuit 134 to reset counters 114, 116 and 118. With the $\overline{Q}$ signal low from flip-flop 126 on line 178 and the Q output high from flip-flop 126 on line 164, gating circuit 122 once again passes pulses from clock 56 to counter 114 and counters 114 and 116 will count in the usual fashion. However after counter 116 has accumulated its ninth count, upon the occurrence of the next count the overflow to period counter 130 produces an output on line 60 which returns to electronic switch 18a and turns off all power to the system. If before the end of the ten second interval start button 58 is depressed the signal on line 142 causes counter reset circuit 134 to reset the counters and restart the ten second display cycle for the temperature. The signal produced by electronic switch 18a does not affect flip-flop reset 128 and so does not reset flip-flops 124 and 126 because the necessary second input to flip-flop reset circuit 128 on line 144 is low since the $\overline{Q}$ output of flip-flop 126 is low in the set state.

Figure 3:
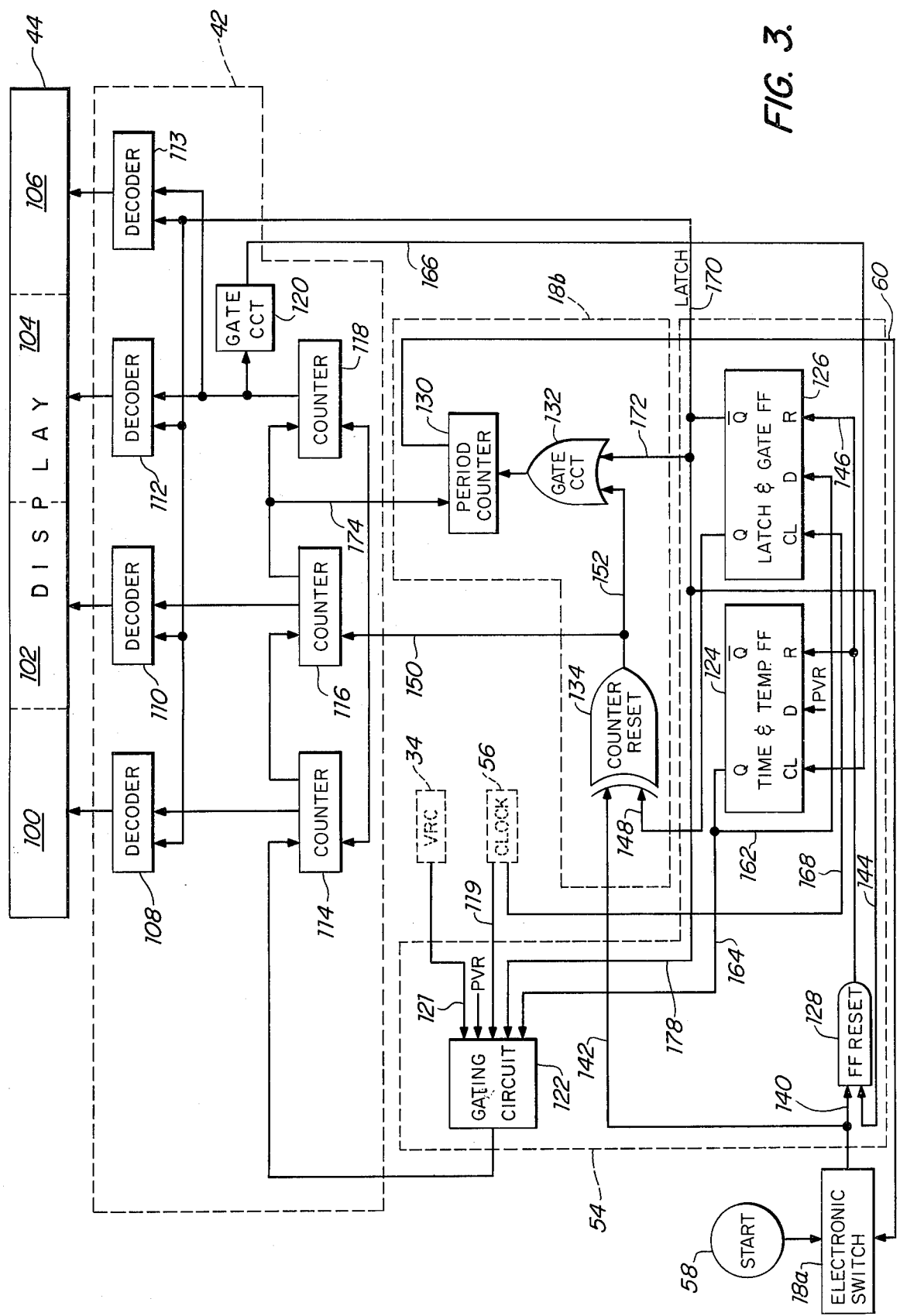
FIG. 3 is a more detailed block diagram of the digital control logic, digital counting and decoding circuit, digital display, and automatic on/off display timed electronic switch of FIG. 2.

Electronic switch 18a, FIG. 3 may include a pair of terminals 200, 202 for connecting a battery through diode 204 to ground 206 and directly to line 208. Latching circuit 210 includes transistor 212 with its emitter connected to line 208 and its collector to the precision voltage regulation, PVR, bus. The base of transistor 212 is connected through resistor 214 to battery terminal 200 and directly to the collector of second transistor 216 whose emitter is connected to ground 206 through resistor 218. Drive circuit 220 includes an amplifier 222 whose negative input 224 is connected to the voltage divider consisting of resistors 226, 228 and 230. A capacitor 232 is connected in parallel with resistors 226 and 228 between negative input 224 and the PVR bus. Positive input 234 of amplifier 222 is connected directly to the collector of transistor 236 whose emitter is connected to ground 206 and whose base is connected through a resistor 238 to the PVR bus. A second resistor 240 interconnects the base and collector of transistor 236. Capacitor 242 connected between ground 206 and the PVR bus acts to store the voltage provided during the momentary operation of actuator 58 and functions as a part of electronic switch 18a. Diodes 244 connected between the PVR bus and provisional power supply bus 250 are considered a part of precision voltage regulator 50 in combination with transistor 236 and its associated circuitry. Drive circuit 220 may also be considered as a functioning part of circuit 50.

In operation when start button or actuator 58 is closed battery voltage is applied from line 208 around to the provisional power supply bus 250 to the anodes of diodes 244 which are interconnected with ground by means of a resistor 252. With a battery supply of seven volts and the nominal drop across each of diodes 244 of 0.6 volts, the initial voltage on the PVR bus is 5.2 volts. This voltage causes capacitor 242 to charge so that after the release of start button 58 there is sufficient voltage on the PVR bus, after the voltage has ceased from provisional power supply bus 250, to cause amplifier 222 to operate. Transistor 236 and its associated circuitry is temperature-compensated to provide a constant voltage, e.g. 0.1 volt positive, at input 234 of amplifier 222. When the PVR bus is at five volts the negative input 224 to amplifier 222 is also at 0.1 volt; however, as soon as the charge in capacitor 242 dissipates to the point where the PVR bus is below 5 volts, the voltage on input 224 will drop below 0.1 volt, causing amplifier 222 to provide a positive voltage at its output to the base of transistor 216. This turns on transistor 216 which turns on transistor 212 and connects the battery supply at 208 directly onto the PVR bus. The system is now latched on and stays on maintaining the five volt level on the PVR bus until an external signal on line 60 from period counter 130 is delivered through diode 254 to drive input 224 positive with respect to input 234 of amplifier 222 and prevent further output to transistor 216 which cuts off transistor 212 and stops all power to the system.

Figure 5:
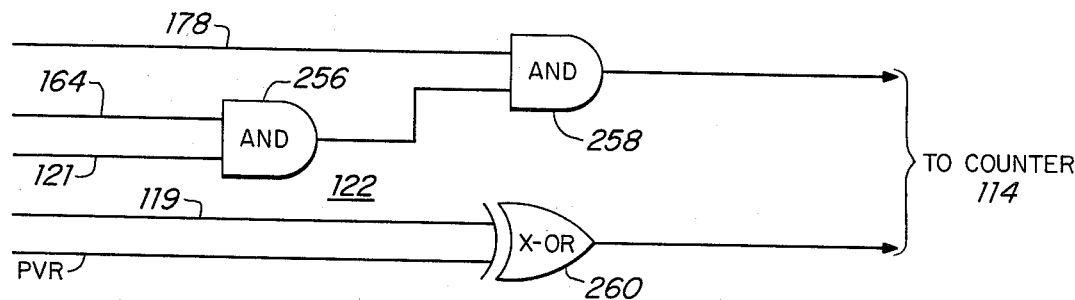

Gating circuit 122, FIG. 3, may be implemented as shown in FIG. 5 with two AND gates 256, 258 and an exclusive-OR gate 260. AND gate 256 passes the pulses on line 121 from voltage to rate converter circuit 34 only when the Q output of flip-flop 124 is high. AND gate 258 passes those pulses received from AND gate 256 only while the $\overline{Q}$ output of flip-flop 126 is high on input 178. Exclusive-OR gate 160 has one input, PVR, which is ever-present and the second input on line 119 which is present once each 100 milliseconds upon the occurrence of a clock pulse. Thus during the period when there are no clock pulses an output pulse is produced by exclusive-OR circuit 260; thus the output of exclusive-OR gate 260 is the inverse of the clock signal on line 119. The output of exclusive-OR gate 260 is counted by counter 114 when counter 114 is enabled by the output of AND gate 258 during the time mode of operation. During the temperature mode of operation the much higher frequency pulses from the voltage to rate converter circuit 34 on line 121 are passed through AND gate 258 and are counted during the period of one clock pulse inversion from exclusive-OR gate 260 following which flip-flop 126 is set and its $\overline{Q}$ output returns to zero disabling AND gate 258.

Other embodiments will occur to those skilled in the art and are within the following claims:

What is claimed is:

1. In an electronic thermometer system comprising: power supply means;
    a temperature measuring circuit for measuring temperature variations and providing a signal representative thereof;
    normally open actuator switch means having a momentary closure property;
    a time measuring circuit;
    a display circuit responsive to said time measuring circuit and said temperature measuring circuit, for indicating the measured temperature during one period and the measured time during another period;
    the improvement comprising an automatic on/off digitally timed electronic switch responsive to momentary closure of said actuator means to turn on and remain on for a predetermined interval and thereby to energize said time measuring circuit, said temperature measuring circuit, and said display circuit said automatic on/off switch including:
    an electronic switch including a latching circuit means adapted for connection to said power supply means; interim enabling means activated for a fixed temporary period by closure of said actuator means; a drive circuit means for operating said time and temperature measuring circuits and said display circuit responsive to said interim enabling means to provisionally begin operating and to provide a gating signal to operate said latching circuit; and means interconnecting said latching circuit and said drive circuit and responsive to provisional operation of said drive means, for subsequently continuing operation of said drive circuit independent of the momentary enablement of said interim means; and,
    a digital timer circuit including counting means successively responsive to momentary operation of said actuator, and thence to said means for subsequently continuing, to begin counting and provide at a predetermined count an output to inhibit further operation of said drive circuit and deenergize said latching circuit.

2. The system of claim 1 in which said digital timer circuit includes a reset circuit responsive to each momentary application of power effected by operation of the actuator to recycle said counting means and reinitiate the predetermined interval.

3. An automatic on/off digitally timed electronic switch responsive to momentary operation of an actuator means to turn on and remain on for a predetermined interval comprising:
    an electronic switch including a latching circuit adapted for connection to a power supply; interim enabling means, activated for a fixed temporary period by closure of said actuator means; a drive circuit responsive to said interim enabling means to provisionally begin operating and to provide a gating signal to operate said latching circuit; and means interconnecting said latching circuit and said drive circuit and responsive to provisional operation of said drive means, for subsequently continuing operation of said drive circuit independent of the momentary enablement by said interim means; and,
    a digital timer circuit including counting means responsive successively to momentary operation of said actuator and thence to said means for subsequently continuing, to begin counting and provide at a predetermined count an output to inhibit further operation of said drive circuit and deenergize said latching circuit.

4. The switch of claim 3 in which said digital timer circuit includes a reset circuit responsive to each momentary application of power effected by operation of the actuator to recycle said counting means and reinitiate the predetermined interval.

5. In an electronic thermometer system comprising; power supply means;
    a temperature measuring circuit for measuring temperature variations and providing a signal representative thereof;
    normally open actuator switch means having a momentary closure property;
    a time measuring circuit;
    a display circuit responsive to said time measuring circuit and said temperature measuring circuit, for indicating the measured temperature during one period and the measured time during another period;
    the improvement comprising an automatic on/off digitally timed electronic switch responsive to momentary closure of said actuator means to turn on and remain on for a predetermined interval, and thereby to energize said time measuring circuit, said temperature measuring circuit, and said display circuit, said automatic on/off switch including:
    a capacitor;
    means responsive to closure of said actuator means for charging said capacitor;
    differential amplifier means having first and second input terminals coupled to said capacitor through respective first and second biasing means, said first and second biasing means being operative in opposite complementary fashion in response to select charge levels on said capacitor, said amplifier means having first and second output states in respective association with operation of said first and second biasing means;

latch circuit means, switchably interconnecting said power supply means with said temperature and time measuring circuits and with said display circuit, said latch being in a disconnecting state when said amplifier means output is in said first state, and being in a connecting state when said amplifier means output is in said second state;

whereby momentary charging of said capacitor switches said amplifier means output to said second state, and said latch means locks said amplifier means output in said second state irrespective of discharging of said capacitor.

* * * * *

UNITED STATES PATENT AND TRADEMARK OFFICE
CERTIFICATE OF CORRECTION

PATENT NO. : 4,112,764

DATED : September 12, 1978

INVENTOR(S) : Robert Bruce Turner

It is certified that error appears in the above-identified patent and that said Letters Patent are hereby corrected as shown below:

In Column 2, line 53, "display timed" should read "digitally timed"
In Column 4, line 44, "representig" should be "representing"
In Column 5, line  8, "Q" should be "$\overline{Q}$"
In Column 5, line 13, "$\overline{Q}$" should be "Q"

Signed and Sealed this

Nineteenth Day of June 1979

[SEAL]

Attest:

RUTH C. MASON
*Attesting Officer*

DONALD W. BANNER
*Commissioner of Patents and Trademarks*